US010483984B2

(12) United States Patent
Jung et al.

(10) Patent No.: US 10,483,984 B2
(45) Date of Patent: Nov. 19, 2019

(54) TEMPERATURE COMPENSATED OSCILLATION CONTROLLER AND TEMPERATURE COMPENSATED CRYSTAL OSCILLATOR INCLUDING THE SAME

(71) Applicant: SAMSUNG ELECTRONICS CO., LTD., Suwon-si, Gyeonggi-Do (KR)

(72) Inventors: Sangdon Jung, Yongin-si (KR); Dokyung Lim, Seoul (KR); Wooseok Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 88 days.

(21) Appl. No.: 15/803,026

(22) Filed: Nov. 3, 2017

(65) Prior Publication Data
US 2018/0198451 A1 Jul. 12, 2018

(30) Foreign Application Priority Data

Jan. 10, 2017 (KR) .................. 10-2017-0003661

(51) Int. Cl.
*H03L 1/02* (2006.01)
*H03B 5/04* (2006.01)
*H03B 5/32* (2006.01)
*H03B 5/36* (2006.01)
*H03B 5/08* (2006.01)

(52) U.S. Cl.
CPC ............ *H03L 1/028* (2013.01); *H03B 5/04* (2013.01); *H03B 5/08* (2013.01); *H03B 5/32* (2013.01); *H03B 5/368* (2013.01); *H03L 1/022* (2013.01); *H03L 1/027* (2013.01); *H03B 2201/0266* (2013.01)

(58) Field of Classification Search
CPC ....................................................... H03L 1/028
USPC ........................................................ 331/176
See application file for complete search history.

(56) References Cited

U.S. PATENT DOCUMENTS

| 4,607,237 | A | 8/1986 | Aota |
| 5,731,742 | A | 3/1998 | Wojewoda et al. |
| 6,362,699 | B1 | 3/2002 | Fry |
| 8,729,977 | B2 | 5/2014 | Filipovic et al. |
| 9,182,295 | B1 | 11/2015 | Perrott et al. |

(Continued)

OTHER PUBLICATIONS

Fox, A., "Fractional-N synthesis improves reference-frequency implementations", www.ednmag.com, Jun. 13, 2002, pp. 81-90.

(Continued)

*Primary Examiner* — Joseph Chang
(74) *Attorney, Agent, or Firm* — F. Chau & Associates, LLC

(57) ABSTRACT

A temperature compensated oscillation controller includes a temperature compensation circuit configured to provide a reference voltage through a first terminal and to receive an input voltage including temperature information through a second terminal, and an oscillation circuit configured to be connected to an external crystal resonator through third and fourth terminals and to output a clock signal in response to an oscillation signal from the external crystal resonator. The temperature compensation circuit is configured to perform a voltage controlled oscillator-based sensing operation to convert the input voltage into a temperature code and to adjust a frequency of the clock signal using the temperature code.

19 Claims, 9 Drawing Sheets

(56) References Cited

U.S. PATENT DOCUMENTS

| | | | | |
|---|---|---|---|---|
| 2002/0158700 A1* | 10/2002 | Nemoto | ............... | H03B 5/04 |
| | | | | 331/158 |
| 2008/0224786 A1 | 9/2008 | Stolpman et al. | | |
| 2015/0285691 A1 | 10/2015 | Caffee et al. | | |
| 2017/0194965 A1* | 7/2017 | Yonezawa | ............... | H03L 1/00 |

OTHER PUBLICATIONS

Fox, A., "Fractional-N synthesis improves reference-frequency implementations", www.edn.com, Jun. 13, 2002, pp. 1-6.

\* cited by examiner

[1st Graph]
[Before Calibration]

[2nd Graph]
[After Calibration]

TEMPERATURE COMPENSATED OSCILLATION CONTROLLER AND TEMPERATURE COMPENSATED CRYSTAL OSCILLATOR INCLUDING THE SAME

CROSS-REFERENCE TO RELATED APPLICATION

This U.S. non-provisional patent application claims priority under 35 U.S.C. § 119 to Korean Patent Application No. 10-2017-0003661, filed on Jan. 10, 2017, the disclosure of which is incorporated by reference herein in its entirety.

TECHNICAL FIELD

Exemplary embodiments of the inventive concept relate to electronic circuits, and more particularly, to a temperature compensated oscillation controller and a temperature compensated crystal oscillator including the same.

DISCUSSION OF RELATED ART

Electronic circuits included in electronic devices such as a computer, a smart phone, a tablet, a server, a workstation, etc. require a reference clock having a specific frequency. To generate the reference clock, various oscillation circuits are used.

A crystal oscillator is a typical type of oscillator that generates the reference clock to be provided to electronic circuits. The crystal oscillator may use a crystal resonator as a control device for an oscillation frequency to generate the reference clock having high stability. However, crystal oscillators have a characteristic where a frequency of the reference clock changes depending on temperature. Such frequency change due to temperature may degrade reliability of the electronic circuits. To calibrate or compensate this frequency change, a temperature compensated crystal oscillator (TCXO) using a temperature sensor, a voltage controlled TCXO (VC-TCXO), etc. may be used. However, as an area occupied by circuits for temperature compensation increases and the number of elements used in the circuits increases, cost of the devices including these circuits also increases.

SUMMARY

According to an exemplary embodiment of the inventive concept, a temperature compensated oscillation controller may include a temperature compensation circuit configured to provide a reference voltage through a first terminal and to receive an input voltage including temperature information through a second terminal, and an oscillation circuit configured to be connected to an external crystal resonator through third and fourth terminals and to output a clock signal in response to an oscillation signal from the external crystal resonator. The temperature compensation circuit is configured to perform a voltage controlled oscillator-based sensing operation to convert the input voltage into a temperature code and to adjust a frequency of the clock signal using the temperature code.

According to an exemplary embodiment of the inventive concept, a temperature compensated crystal oscillator may include a temperature compensated oscillation controller including first through fourth terminals, a thermistor connected to the first and second terminals, and a crystal resonator connected to the third and fourth terminals. The temperature compensated oscillation controller includes a temperature compensation circuit configured to provide a reference voltage through the first terminal and to receive an input voltage through the second terminal and an oscillation circuit connected to the third and fourth terminals and configured to output a clock signal in response to an oscillation signal of the crystal resonator. The temperature compensation circuit is configured to convert the input voltage into a temperature code by performing a voltage controlled oscillator-based sensing operation and to adjust a capacitance of the third and fourth terminals using the temperature code.

According to an exemplary embodiment of the inventive concept, a user system includes a first plurality of configuration elements, a second plurality of configuration elements, a first temperature compensated crystal oscillator including a switched capacitor and configured to provide a clock signal to the first plurality of configuration elements, and a second temperature compensated crystal oscillator including an external resistor and configured to provide the clock signal to the second plurality of configuration elements. Each of the first and second temperature compensated crystal oscillators further includes a temperature compensated oscillation controller including first through fourth terminals, a thermistor connected to the first and second terminals, and a crystal resonator connected to the third and fourth terminals. The temperature compensated oscillation controller includes a temperature compensation circuit configured to provide a reference voltage through the first terminal and to receive an input voltage including temperature information through the second terminal, and an oscillation circuit connected to the third and fourth terminals and configured to output the clock signal in response to an oscillation signal of the crystal resonator. The temperature compensation circuit is configured perform a voltage controlled oscillator-based sensing operation to convert the input voltage into a temperature code and to adjust a frequency of the clock signal using the temperature code.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Figure 1:
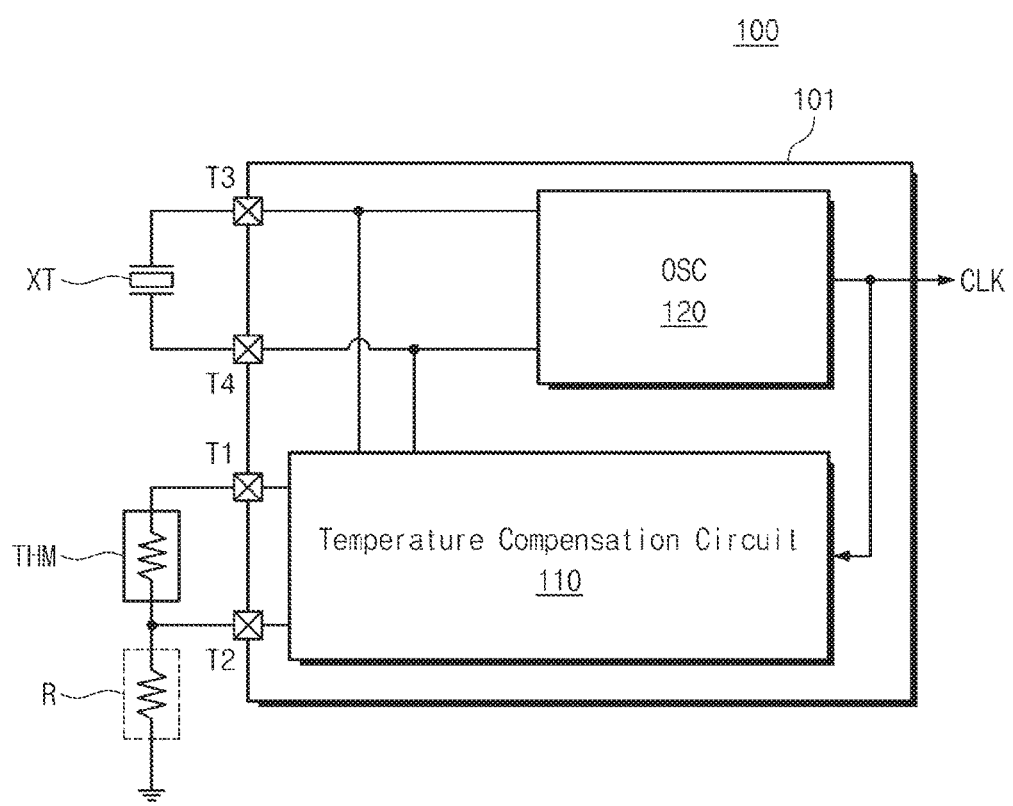
FIG. 1 is a view illustrating a temperature compensated crystal oscillator according to an exemplary embodiment of the inventive concept.

Exemplary embodiments of the inventive concept will be described more fully hereinafter with reference to the accompanying drawings. Like reference numerals may refer to like elements throughout this application.

FIG. 1 is a view illustrating a temperature compensated crystal oscillator according to an exemplary embodiment of the inventive concept. Referring to FIG. 1, a temperature compensated crystal oscillator 100 may include an oscillation controller 101, a crystal resonator XT, a thermistor THM, and a resistor R. The oscillation controller 101 is connected to the crystal resonator XT, the thermistor THM, and the resistor R through first through fourth terminals (T1, T2, T3, T4). The oscillation controller 101 includes a temperature compensation circuit 110 and an oscillation circuit 120. The oscillation controller 101 may be a temperature compensated oscillation controller capable of compensating a frequency change of a clock signal CLK depending on a temperature.

The crystal resonator XT may be connected to the oscillation circuit 120 through the third and fourth terminals T3 and T4. The crystal resonator XT may output an oscillation signal that vibrates at its natural frequency. The natural frequency of the crystal resonator XT may be determined according to a device characteristic of the crystal resonator XT. The oscillation circuit 120 may output the clock signal CLK based on the oscillation signal from the crystal resonator XT. For convenience of description, an example of the crystal resonator XT is described. However, the inventive concept is not limited thereto, and the crystal resonator XT may include crystal, Rochelle salt, barium titanate, ceramic, etc. that can generate a piezoelectric phenomenon.

The temperature compensation circuit 110 is connected to the first through fourth terminals (T1, T2, T3, T4). The temperature compensation circuit 110 may compensate a change (e.g., frequency change) of the clock signal CLK depending on a temperature. For example, the thermistor THM may be connected to the first and second terminals T1 and T2. The thermistor THM is a variable resistance device of which a resistance value is changed depending on a temperature. The temperature compensation circuit 110 may apply a reference voltage through the first terminal T1 and may receive an input voltage through the second terminal T2. The input voltage may change depending on the resistance value of the thermistor THM. Thus, since the resistance value of the thermistor THM is changed depending on temperature, the input voltage provided through the second terminal T2 may have a value that is changed depending on temperature. In other words, the input voltage provided from the thermistor THM through the second terminal T2 may include information about temperature.

In FIG. 1, the temperature compensated crystal oscillator 100 includes the thermistor THM, but the inventive concept is not limited thereto. For example, the thermistor THM may be replaced with a different temperature sensor sensing a temperature or other passive or active devices of which output parameters (e.g., resistance, capacitance, inductance, current, voltage, etc.) are changed depending on a temperature.

The temperature compensation circuit 110 may detect a temperature of the temperature compensated crystal oscillator 100 based on the received input voltage and may calibrate a frequency of the clock signal CLK based on the detected temperature. The temperature detection operation may be performed in a voltage controlled oscillator (VCO)-based digital sensing scheme. The VCO-based digital sensing scheme will be described in detail below.

In exemplary embodiments of the inventive concept, the resistor R may be connected between the second terminal T2 and a ground to detect temperature with greater accuracy. For example, the resistance value of the thermistor THM may exponentially change due to temperature. In other words, since the resistance value of the thermistor THM is sharply changed at high temperature, the input voltage is also sharply changed at high temperature and this may make it difficult to accurately detect the temperature. By connecting the resistor R between the second terminal T2 and the ground, the input voltage may be linearized according to temperature. In other words, accurate temperature detection may be achieved by connecting the resistor R between the second terminal T2 and the ground. As the thermistor THM and the resistor R are serially connected to each other, linearity and consistency of the input voltage may be achieved according to not only a temperature change but also changes in process, voltage, and temperature.

The temperature compensation circuit 110 and the oscillation circuit 120 of the oscillation controller 101 may be embodied by a semiconductor chip, a die, or a module. The crystal resonator XT, the thermistor THM, and the resistor R may be embodied by a device, a package, or a module separated from the oscillation controller 101.

Figure 2:
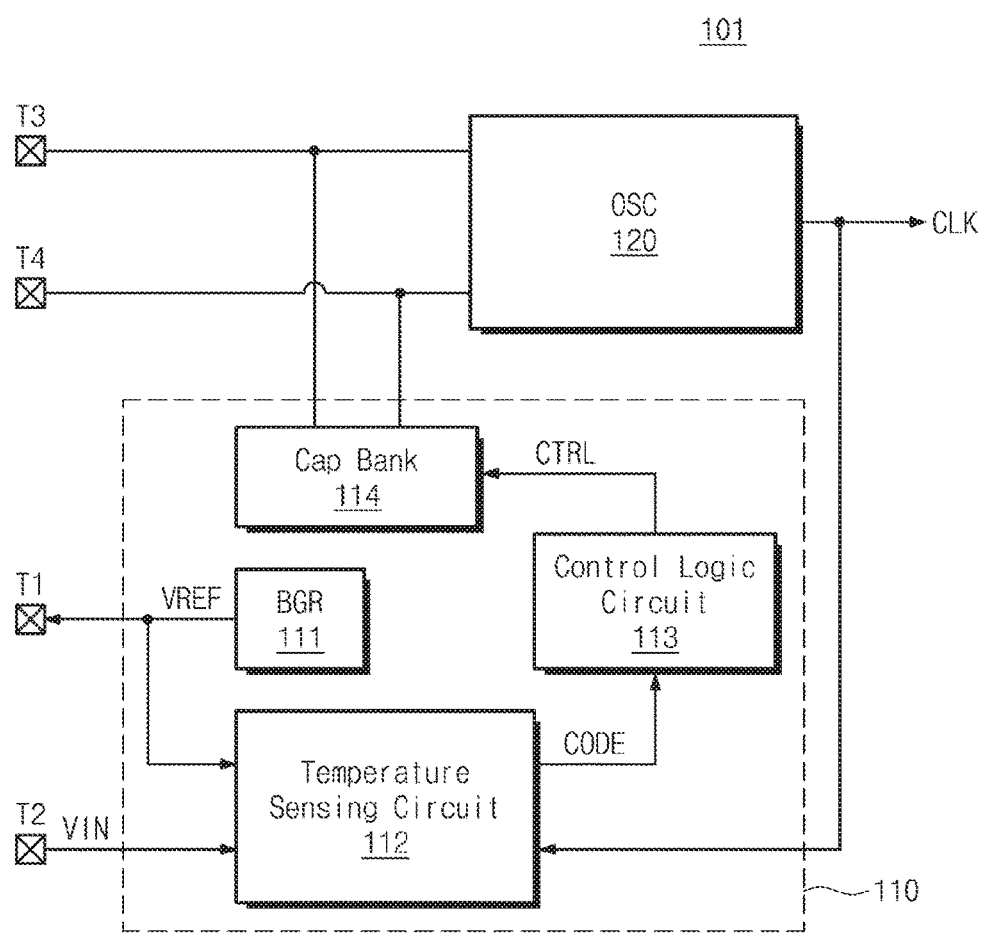
FIG. 2 is a block diagram illustrating a temperature compensation circuit of FIG. 1 in detail according to an exemplary embodiment of the inventive concept.

FIG. 2 is a block diagram illustrating a temperature compensation circuit of FIG. 1 in detail according to an exemplary embodiment of the inventive concept. For brevity in the drawings, configuration elements unnecessary to describe an operation of the temperature compensation circuit 110 are omitted. Terms for performing or including a specific function or terms such as a "block", a "unit", or a "circuit" that are described or illustrated below may be embodied in software, hardware, or combinations thereof.

Referring to FIGS. 1 and 2, as described above, the oscillation controller 101 may include the temperature compensation circuit 110 and the oscillation circuit 120. The oscillation circuit 120 is connected to the third and fourth terminals T3 and T4 and outputs the clock signal CLK. The temperature compensation circuit 110 may include a bandgap reference 111, a temperature sensing circuit 112, a control logic circuit 113, and a capacitor bank 114.

The bandgap reference 111 may generate a reference voltage VREF. The reference voltage VREF may be provided to the first terminal T1 and the temperature sensing circuit 112. The reference voltage VREF may be provided to the thermistor THM through the first terminal T1. The thermistor THM may output the reference voltage VREF as an input voltage VIN.

The temperature sensing circuit 112 may receive the input voltage VIN through the second terminal T2. The input voltage VIN may include temperature information. For example, as described above, the reference voltage VREF is applied to the thermistor THM and the thermistor THM may output the input voltage VIN in response to the reference voltage VREF. Since the input voltage VIN is a voltage that reflects a voltage drop by a resistance value of the thermistor THM that changes depending on temperature, a temperature of the temperature compensated crystal oscillator 100 may be detected by sensing the input voltage VIN.

The temperature sensing circuit 112 may convert the received input voltage VIN into a digital code CODE (hereinafter it is referred to as a temperature code) to output it. In exemplary embodiments of the inventive concept, the temperature sensing circuit 112 may perform a voltage controlled oscillator (VCO)-based sensing operation, unlike a conventional analog-to-digital converter (ADC). The conventional ADC requires a large area and high power consumption. However, since the temperature sensing circuit 112 performs the VCO-based sensing operation, the temperature sensing circuit 112 may have reduced area and power consumption as compared with the conventional ADC.

In exemplary embodiments of the inventive concept, the temperature sensing circuit 112 may perform a calibration operation of a voltage controlled oscillator (refer to FIGS. 3 and 5) included in the temperature sensing circuit 112 using the reference voltage VREF from the bandgap reference 111. A configuration and an operation of the temperature sensing circuit 112 will be described in further detail with reference to FIGS. 3 and 4.

The control logic circuit 113 may receive the temperature code CODE from the temperature sensing circuit 112 and may output a control signal CTRL based on the received temperature code CODE. The control signal CTRL may be a control signal corresponding to the temperature code CODE. A configuration and an operation of the control logic circuit 113 will be described in further detail with reference to FIG. 6.

The capacitor bank 114 may be connected to the third and fourth terminals T3 and T4. The capacitor bank 114 may adjust capacitance of the third and fourth terminals T3 and T4 in response to the control signal CTRL from the control logic circuit 113. A frequency of the clock signal CLK being output from the oscillation circuit 120 may be adjusted by adjusting the capacitance of the third and fourth terminals T3 and T4. An operation of the capacitor bank 114 will be described in further detail with reference to FIG. 7.

Figure 3:
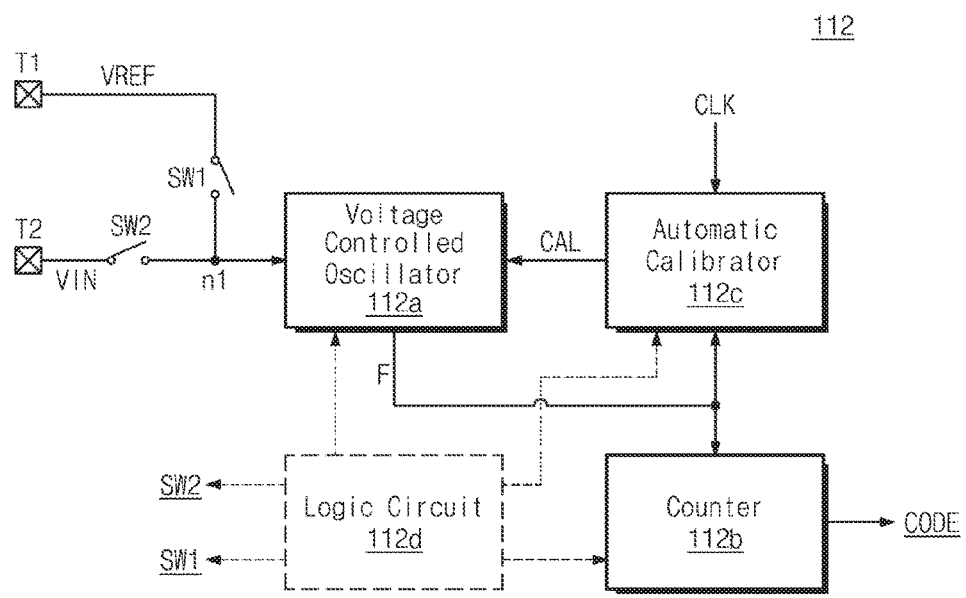
FIG. 3 is a block diagram illustrating a temperature sensing circuit of FIG. 2 according to an exemplary embodiment of the inventive concept.
Figure 4:
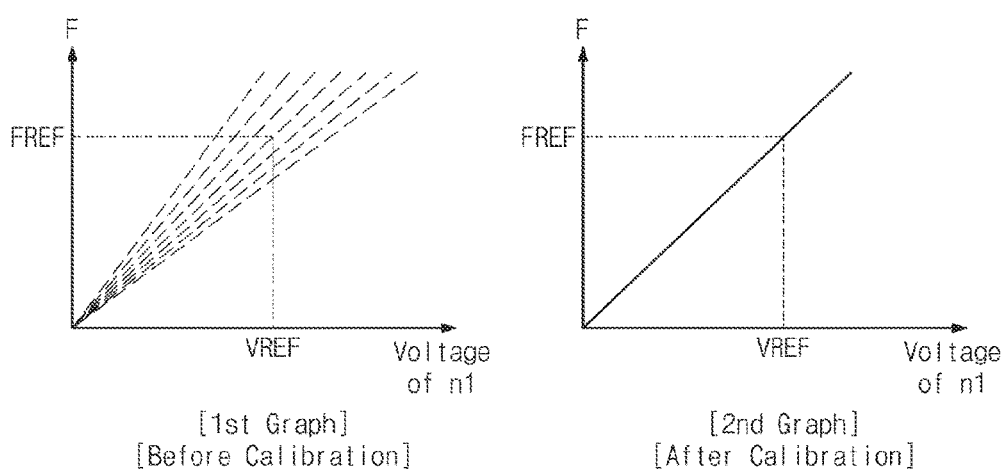
FIG. 4 illustrates graphs for explaining a characteristic of a voltage controlled oscillator of FIG. 3 according to an exemplary embodiment of the inventive concept.

FIG. 3 is a block diagram illustrating a temperature sensing circuit of FIG. 2 according to an exemplary embodiment of the inventive concept. FIG. 4 illustrates graphs for explaining a characteristic of a voltage controlled oscillator of FIG. 3 according to an exemplary embodiment of the inventive concept. For brevity of description, configurations unnecessary to describe the temperature sensing circuit 112 are omitted. Referring to FIGS. 1 through 3, the temperature sensing circuit 112 may include a voltage controlled oscillator 112a, a counter 112b, an automatic calibrator 112c, and first and second switches SW1 and SW2.

The first switch SW1 is connected between the first terminal T1 and a first node (n1). In other words, the first switch SW1 may be configured to provide the reference voltage VREF to the first node (n1). The second switch SW2 is connected between the second terminal T2 and the first node (n1). In other words, the second switch SW2 may be configured to provide the input voltage VIN to the first node (n1).

The voltage controlled oscillator 112a may receive a voltage of the first node (n1) and may output an output signal F in response to the received voltage. A frequency of the output signal F may be proportional to the voltage of the first node (n1).

The counter 112b may count the output signal F to output the temperature code CODE. The counter 112b may count the output signal F for a specific period of time to output the temperature code CODE which is a digital value. In other words, the temperature code CODE may include information about the frequency of the output signal F.

The temperature code CODE may also include information about a temperature of the temperature compensated crystal oscillator 100. For example, in the case where the second switch SW2 is turned on, the voltage of the first node (n1) may be the input voltage VIN. As described above, the input voltage VIN includes the temperature information of the temperature compensated crystal oscillator 100. The input voltage VIN at the first node (n1) may be provided to the voltage controlled oscillator 112a, and the voltage controlled oscillator 112a may output the output signal F having a frequency which is proportional to the input voltage VIN. The counter 112b may count the output signal F to output the temperature code CODE including information about the frequency of the output signal F. As a result, the temperature sensing circuit 112 may output the temperature code CODE (e.g., a digital code) including the temperature information based on the input voltage VIN.

In exemplary embodiments of the inventive concept, an output frequency of the voltage controlled oscillator 112a may be unstable depending on characteristics of process, voltage, or temperature (PVT). As illustrated in a first graph of FIG. 4, even though the same voltage (e.g., the reference voltage VREF) is applied to the voltage controlled oscillator 112a, a frequency of the output signal F of the voltage controlled oscillator 112a may be variously changed according to a PVT variation. Thus, the temperature information included in the temperature code CODE output from the counter 112b may not be accurate.

To calibrate a frequency change according to the PVT variation of the voltage controlled oscillator 112a, the automatic calibrator 112c may perform a calibration operation. For example, the automatic calibrator 112c may receive the clock CLK from the oscillation circuit 110 and may receive the output signal F from the voltage controlled oscillator 112a. The automatic calibrator 112c may compare a frequency of the output signal F with a frequency of the clock signal CLK to output a calibration signal CAL. The voltage controlled oscillator 112a may adjust internal parameters (e.g., an internal resistor, an internal capacitor, etc.) to calibrate itself in response to the calibration signal CAL. The calibrated voltage controlled oscillator 112a may be configured to output the output signal F having an intended frequency.

For example, during a calibration operation of the automatic calibrator 112c, the first switch SW1 may be turned on. In this case, a voltage of the first node (n1) is the reference voltage VREF. The voltage controlled oscillator 112a may output the output signal F in response to the reference voltage VREF at the first node (n1). The output signal F may not have a reference frequency FREF (e.g., an intended frequency) as illustrated in the first graph of FIG. 4. In this case, the automatic calibrator 112c may compare the output signal F with the clock signal CLK and may output the calibration signal CAL based on a comparison result. The voltage controlled oscillator 112a may calibrate or adjust internal parameters according to the calibration signal CAL. As illustrated in a second graph of FIG. 4, the calibrated voltage controlled oscillator 112a may output the output signal F having the reference frequency FREF in response to the reference voltage VREF. Accordingly, the frequency change due to the PVT variation of the voltage controlled oscillator 112a may be calibrated through the above-described calibration operation.

The temperature sensing circuit 112 may periodically or non-periodically repeat the calibration operation and the temperature sensing operation (e.g., an operation of outputting the temperature code CODE). For example, the temperature sensing circuit 112 may perform the calibration operation by the automatic calibrator 112c in a state where the first switch SW1 is turned on and the second switch SW2 is turned off. After the calibration operation is completed, the temperature sensing circuit 112 may perform the temperature sensing operation of generating the temperature code CODE in a state where the first switch SW1 is turned off and the second switch SW2 is turned on.

As described above, the temperature sensing circuit 112 may perform a temperature sensing or temperature code generation operation using the voltage controlled oscillator. The temperature sensing circuit 112 may occupy a relatively small area and reduce power consumption as compared with a conventional ADC.

The temperature sensing circuit 112 may further include a logic circuit 112d. The logic circuit 112d may control the voltage controlled oscillator 112a, the counter 112b, the automatic calibrator 112c, and the first and second switches SW1 and SW2 so that the operation of generating the temperature code CODE and the calibration operation are performed. For example, during the calibration operation, the logic circuit 112d may control the first switch SW1 so that the first switch SW1 is turned on and may control the voltage controlled oscillator 112a and the automatic calibrator 112c to operate. During the operation of generating the temperature code CODE, the logic circuit 112d may control the second switch SW2 so that the second switch SW2 is turned on and may control the voltage controlled oscillator 112a and the automatic calibrator 112c to operate. Additionally, the logic circuit 112d may control the counter 112b to count the output signal F for a predetermined time.

Figure 5:
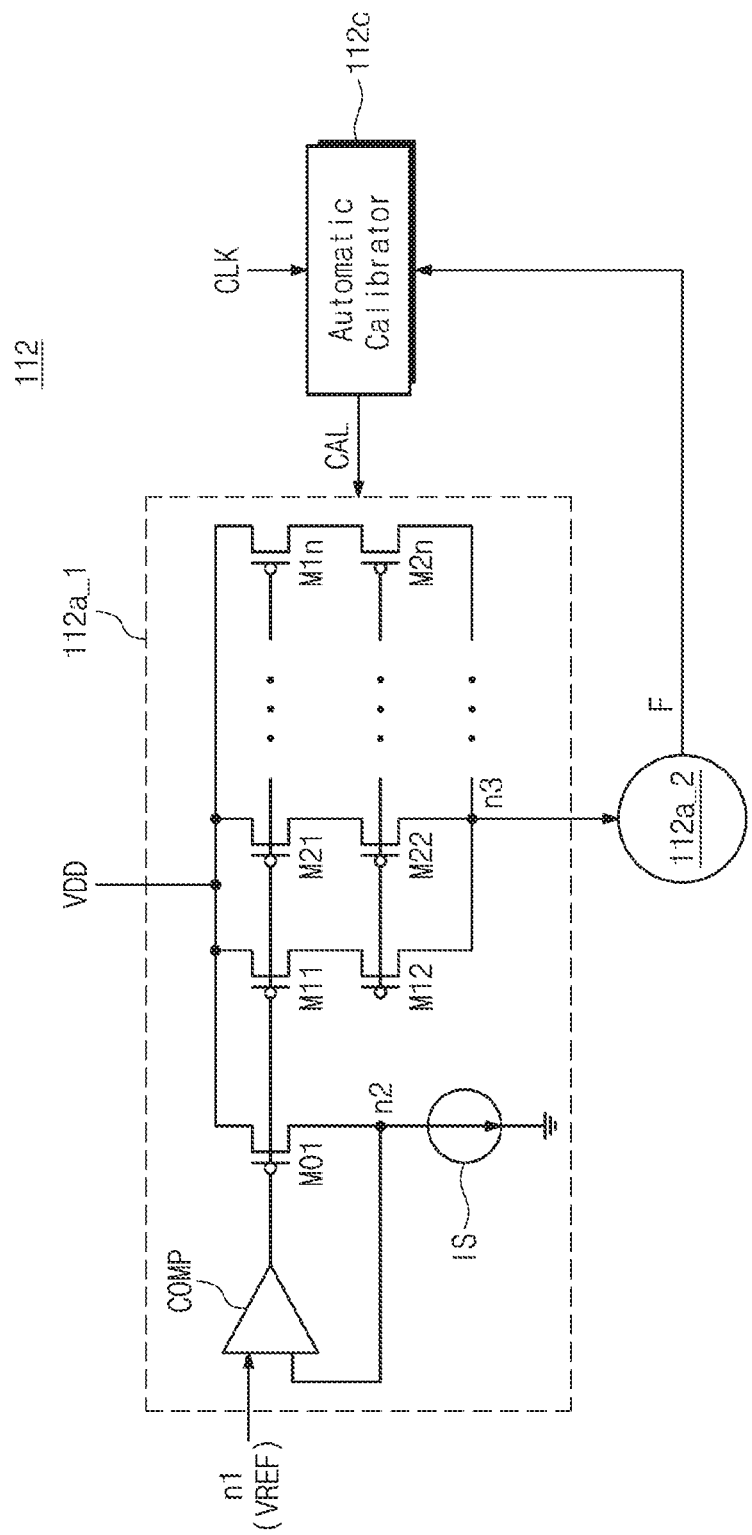
FIG. 5 is a view illustrating a calibration operation of an automatic calibrator of FIG. 3 according to an exemplary embodiment of the inventive concept.

FIG. 5 is a view illustrating a calibration operation of an automatic calibrator of FIG. 3 according to an exemplary embodiment of the inventive concept. An example of the calibration operation is described with reference to FIG. 5 but the inventive concept is not limited thereto. Various circuit configurations or methods may be applied to perform the calibration operation according to exemplary embodiments of the inventive concept. For brevity in the drawings, configuration elements which are unnecessary to describe the calibration operation of the automatic calibrator 112c are omitted.

Referring to FIGS. 3 and 5, the temperature sensing circuit 112 may include the voltage controlled oscillator 112a and the automatic calibrator 112c. The voltage controlled oscillator 112a may include an input circuit 112a_1 and a resonant circuit 112a_2. The resonant circuit 112a_2 may be configured based on an LC element, an RC element, or an active element (e.g., MOSFET, BJT, etc.). The resonant circuit 112a_2 may include a ring-type resonant circuit formed based on various semiconductor devices. However, the configuration in FIG. 5 and the configuration of the resonant circuit described above are only illustrative and, configurations of the voltage controlled oscillator 112a or the resonant circuit 112a_2 are not limited thereto.

The input circuit 112a_1 may include a comparator COMP, a current source IS, and a plurality of transistors (M01 to M2n). A first input stage of the comparator COMP may be configured to receive the voltage of the first node (n1) and a second input stage of the comparator COMP may be configured to receive the voltage of the second node (n2). Since the first switch SW1 is turned on when the calibration operation by the automatic calibrator 112c is performed, the voltage of the first node (n1) may be the reference voltage VREF. In other words, during the calibration operation, the voltage of the second node (n2) may be maintained at the reference voltage VREF.

One end of the transistor M01 is connected to a power supply voltage VDD, the other end of the transistor M01 is connected to the second node (n2), and a gate of the transistor M01 is connected to an output of the comparator COMP. The current source (IS) is connected between the second node (n2) and ground. In other words, a specific amount of unit current may be generated by the comparator COMP, the transistor M01, and the current source (IS).

The plurality of transistors (M01 to M2n) may be connected to one another in series or in parallel. For example, between the power supply voltage VDD and the third node (n3), the transistors (M11, M12) are connected to each other in series, the transistors (M21, M22) are connected to each other in series, and the transistors (M1n, M2n) are connected to each other in series. One end of each group of transistors connected in series is connected to the power supply voltage VDD and the other end thereof is connected to the third node (n3). Gates of some (M11, M21, . . . , M1n) of the transistors connected in series may be connected to the output of the comparator COMP. In other words, the transistors connected in series may constitute a current mirror and the unit current may be provided to the third node (n3) through the transistors connected in series. The resonant circuit 112a_2 may output the output signal F according to an amount of current flowing through the third node (n3).

As described with reference to FIGS. 3 and 4, the automatic calibrator 112c may compare frequencies of the clock signal CLK and the output signal F to output the calibration signal CAL. The input circuit 112a_1 may adjust an amount of current flowing through the third node (n3) by turning on or off some of the transistors (M12, M22, . . . , M2n) connected in series in response to the calibration signal CAL. The resonant circuit 112a_2 may output the output signal F according to the amount of adjusted current at the third node (n3). The automatic calibrator 112c may adjust an amount of unit current (e.g., the amount of current at the third node (n3)) in the input circuit 112a_1 by repeatedly performing the operation described above and thus the resonant circuit 112a_2 may output the output signal F having the reference frequency FREF.

The calibration method described above is only illustrative and the inventive concept is not limited thereto. For example, the voltage controlled oscillator 112a may adjust an internal capacitance value, an internal resistance value, etc., in response to the calibration signal CAL from the automatic calibrator 112c, so that the output signal F having the reference frequency FREF is output. Alternatively, the voltage controlled oscillator 112a and the automatic calibrator 112c may have a configuration similar to that of a phase locked loop (PLL).

Figure 6:
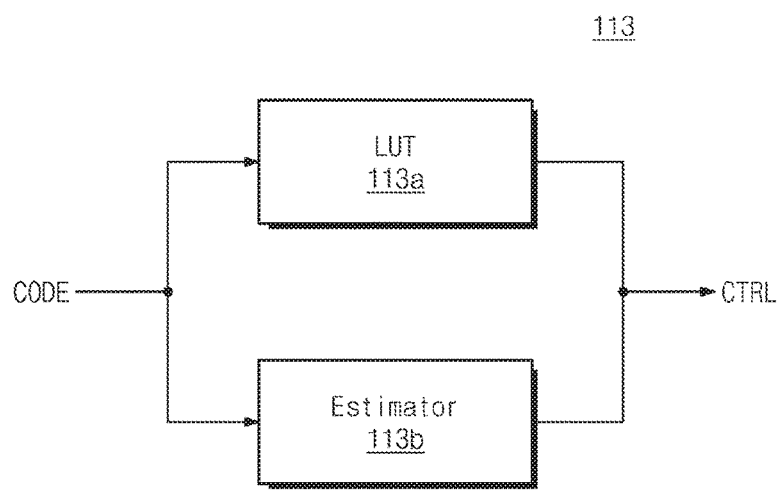
FIG. 6 is a block diagram illustrating an operation of a control logic circuit of FIG. 2 according to an exemplary embodiment of the inventive concept.

FIG. 6 is a block diagram illustrating an operation of a control logic circuit of FIG. 2 according to an exemplary embodiment of the inventive concept. For brevity in the drawings and convenience of description, configuration elements unnecessary to describe a configuration and an operation of the control logic circuit 113 are omitted.

Referring to FIGS. 2 and 6, the control logic circuit 113 may include a look-up table 113a or an estimator 113b. Although the look-up table 113a and the estimator 113b are both illustrated in FIG. 6, the control logic circuit 113a may include one of or both the look-up table 113a and the estimator 113b.

The look-up table 113a may include control information corresponding to the temperature code CODE. The control information may be information for controlling a capacitance of the capacitor bank 114 according to temperature. In the case where the temperature code CODE indicates a first temperature, to compensate a frequency change of the clock signal CLK according to temperature, the third terminal T3 may be set to have a first capacitance and the fourth terminal T4 may be set to have a second capacitance by the capacitor bank 114. The control information may be information for controlling the capacitor bank 114 so that the third and fourth terminals (T3, T4) have capacitances corresponding to the temperature code CODE. The control information may be output as the control signal CTRL which is in a digital signal form or an analog signal form.

The estimator 113b may perform an arithmetic operation based on a mathematical model of the crystal resonator XT with respect to the temperature code CODE to output the control signal CTRL. For example, a frequency of the crystal resonator XT may be modeled as a mathematic model according to temperature. Thus, the estimator 113b may be configured to perform the arithmetic operation based on the mathematical model of the crystal resonator XT to output the control signal CTRL.

Figure 7:
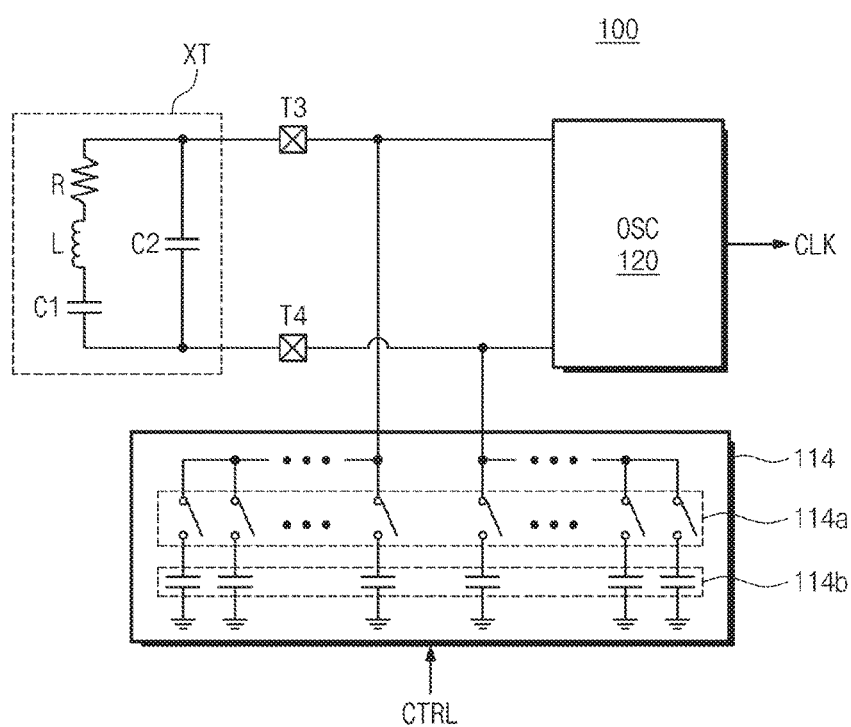
FIG. 7 is a view illustrating a capacitor bank of FIG. 2 according to an exemplary embodiment of the inventive concept.

FIG. 7 is a view illustrating a capacitor bank of FIG. 2 according to an exemplary embodiment of the inventive concept. For brevity of description, configuration elements unnecessary to describe the capacitor bank 114 and an operation of the capacitor bank 114 are omitted. A configuration of the capacitor bank 114 illustrated in FIG. 7 is only illustrative and the inventive concept is not limited thereto.

Referring to FIGS. 2 and 7, the capacitor bank 114 may include a plurality of switches 114a and a plurality of capacitors 114b. The plurality of switches 114a may be connected to the plurality of capacitors 114b.

The capacitor bank 114 may receive the control signal CTRL from the control logic circuit 113 and may adjust capacitance of the third and fourth terminals (T3, T4) in response to the received control signal CTRL. The capacitor bank 114 may adjust capacitance of the third and fourth terminals (T3, T4) by controlling each of the plurality of switches 114a in response to the control signal CTRL.

The crystal resonator XT, as illustrated in FIG. 7, may be an RLC equivalent circuit. For example, the crystal resonator XT may be an equivalent circuit with a structure in which a resistor R, an inductor L, and a first capacitor C1 are connected in series and a second capacitor C2 connected in parallel to the series structure of the resistor R, the inductor L, and the first capacitor C1. A natural vibration frequency of the crystal resonator XT may be determined by a reactance component of the equivalent circuit of the crystal resonator XT illustrated in FIG. 7. In other words, in the case where a frequency of the clock signal CLK is changed depending on a temperature change, the natural vibration frequency can be controlled by adjusting the reactance component of the equivalent circuit of the crystal resonator XT.

Since the third and fourth terminals (T3, T4) are connected to both ends of the second capacitor C2, adjusting capacitance of each of the third and fourth terminals (T3, T4) may have an effect similar to adjusting the reactance component of the equivalent circuit of the crystal resonator XT. The capacitor bank 114 may adjust the capacitance of each of the third and fourth terminals (T3, T4) in response to the control signal CTRL and because of this, a frequency change of the clock signal CLK according to temperature may be compensated.

The capacitor bank 114 is only illustrative and may be replaced with other configuration components. For example, the capacitor bank 114 may include a variable capacitor and may control capacitance of the variable capacitor in response to the control signal CTRL.

Thus, according to an exemplary embodiment of the inventive concept, the oscillation controller 101 may receive the input voltage VIN including temperature information from the thermistor THM and may generate the temperature code CODE based on the received input voltage VIN. The temperature code CODE may be generated by a voltage controlled oscillator-based sensing operation. The oscillation controller 101 may compensate a frequency change depending on temperature by adjusting the capacitance of both ends of the crystal resonator XT based on the temperature code CODE.

Since a conventional temperature compensated crystal oscillator uses a temperature sensor or a diode to sense a temperature, the total cost increases. However, the temperature compensated crystal oscillator 100 according to an exemplary embodiment of the inventive concept may reduce the total cost by using the thermistor THM that is relatively inexpensive as compared with other temperature sensing devices. An accurate temperature detection operation and a frequency compensation operation according to temperature change may be performed through a voltage controlled oscillator (VCO)-based sensing operation. The VCO-based sensing operation has a small area and low power consumption as compared with an ADC. Thus, a temperature compensated crystal oscillator having reduced cost and increased performance may be provided.

Figure 8:
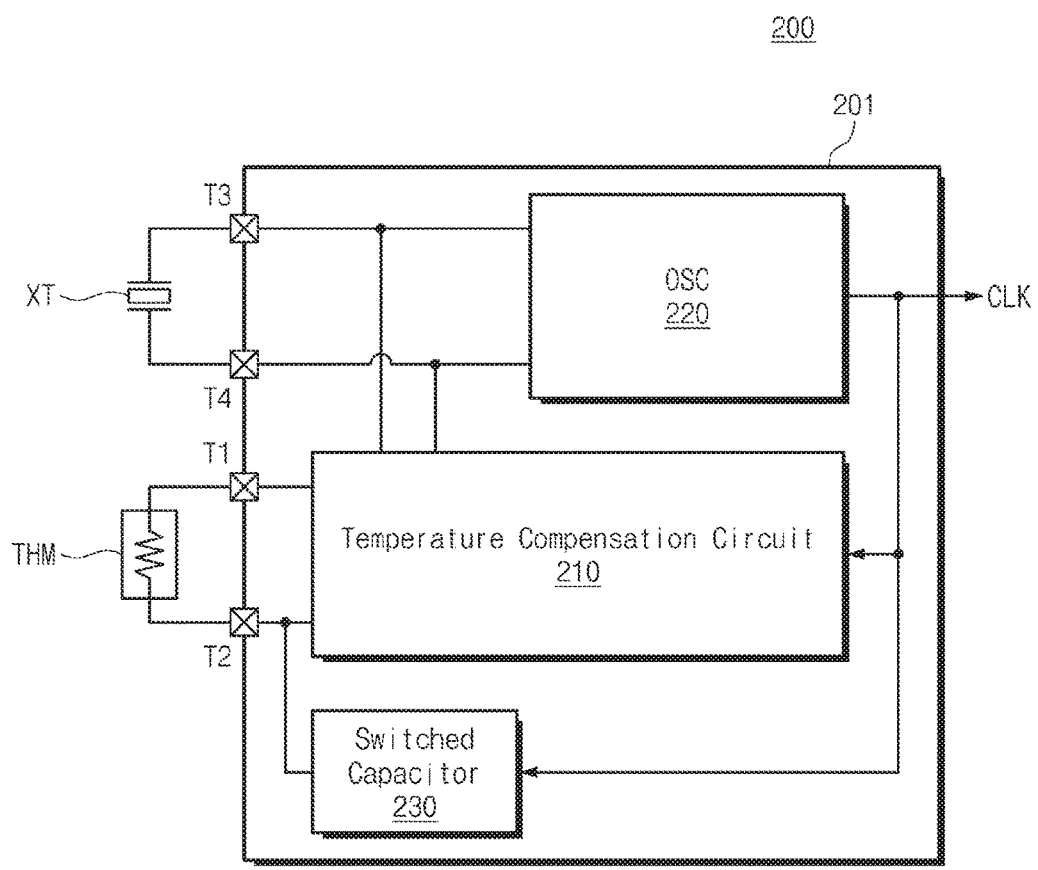
FIG. 8 is a view illustrating a temperature compensated crystal oscillator according to an exemplary embodiment of the inventive concept.

FIG. 8 is a view illustrating a temperature compensated crystal oscillator according to an exemplary embodiment of the inventive concept. For brevity of description, descriptions of configuration components similar to those previously described are omitted.

Referring to FIG. 8, a temperature compensated crystal oscillator 200 may include the crystal resonator XT, the thermistor THM, and an oscillation controller 201. The oscillation controller 201 may include a temperature compensation circuit 210, an oscillation circuit 220, and a switched capacitor 230. Since the crystal resonator XT, the thermistor THM, the oscillation controller 201 (corresponding to the oscillation controller 101), the temperature compensation circuit 210 (corresponding to the temperature compensation circuit 110), and the oscillation circuit 220 (corresponding to the oscillation circuit 120) were described with reference to FIGS. 1 through 7, a detailed description thereof is omitted.

Unlike the temperature compensated crystal oscillator 100 described with reference to FIGS. 1 through 7, the oscillation controller 201 of the temperature compensated crystal oscillator 200 may further include the switched capacitor 230.

The switched capacitor 230 may receive the clock signal CLK and may perform a switching operation based on the received clock signal CLK. The switched capacitor 230 is connected to the second terminal T2 to provide functionality similar to the resistor R of FIG. 1. In other words, even though an external resistor R is removed, linearity with respect to temperature (or PVT) of the input voltage VIN from the thermistor THM may be maintained through an operation of the switched capacitor 230.

Configuration elements of the oscillation controller 201 may be embodied by a semiconductor chip. Cost incurred by adding the switched capacitor 230 in the oscillation controller 201 may be lower than cost incurred by adding the external resistor R. In other words, the external resistor R illustrated in FIG. 1 may be removed by using the switched capacitor 230 included in the oscillation controller 201 and thus cost may be reduced.

Figure 9:
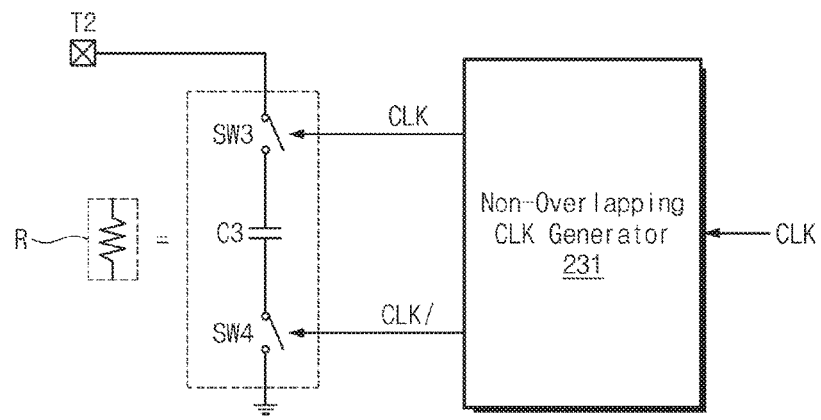
FIG. 9 is a view illustrating a switched capacitor of FIG. 8 in detail according to an exemplary embodiment of the inventive concept.

FIG. 9 is a view illustrating a switched capacitor of FIG. 8 in detail according to an exemplary embodiment of the inventive concept. The switched capacitor 230 illustrated in FIG. 9 is only illustrative and the inventive concept is not limited thereto.

Referring to FIGS. 8 and 9, the switched capacitor 230 may include a non-overlapping clock generator 231, third and fourth switches SW3 and SW4, and a third capacitor C3. The non-overlapping clock generator 231 may receive the clock signal CLK and may output the clock signal CLK and a complementary clock signal CLK/ based on the received clock signal CLK. The complementary clock signal CLK/ may indicate a signal having a phase opposite to that of the clock signal CLK.

The third switch SW3 is connected between the second terminal T2 and one end of the third capacitor C3 and operates in response to the clock signal CLK from the non-overlapping clock generator 231. The fourth switch SW4 is connected between the other end of the third capacitor C3 and ground and operates in response to the complementary clock signal CLK/ from the non-overlapping clock generator 231. The third and fourth switches SW3 and SW4 may be alternately turned on or turned off by the clock signal CLK and the complementary clock signal CLK/. In other words, the third and fourth switches SW3 and SW4 are not turned on at the same time.

Configuration elements between the second terminal T2 and the ground may have a functionality similar to that of the external resistor R due to the switching operation of the third and fourth switches SW3 and SW4. Similar to the configuration of FIG. 1, the switched capacitor 230 may make the input voltage VIN from the thermistor THM maintain linearity.

Figure 10:
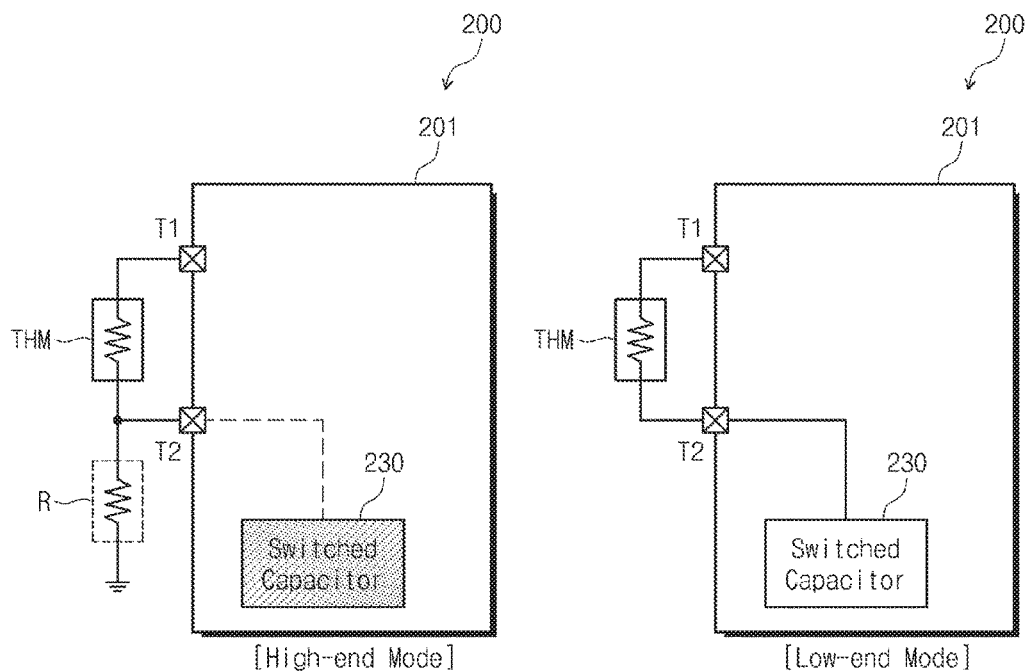
FIG. 10 is a view illustrating an application example with respect to the switched capacitor of FIGS. 8 and 9 according to an exemplary embodiment of the inventive concept.

FIG. 10 is a view illustrating an application example with respect to the switched capacitor of FIGS. 8 and 9 according to an exemplary embodiment of the inventive concept. For brevity of description, configuration elements (e.g., a temperature compensation circuit, an oscillation circuit, etc.) unnecessary to describe the application example with respect to the switched capacitor 230 are omitted.

Referring to FIGS. 8 and 10, the temperature compensated crystal oscillator 200 may operate in one of a high performance mode and a low performance mode. The high performance mode indicates an operation mode where a frequency change of the clock signal CLK is within a first range and the low performance mode indicates an operation mode where a frequency change of the clock signal CLK is within a second range. Here, the first range is smaller than the second range. The high performance mode may indicate an operation mode that allows a frequency error within a first range and the low performance mode may indicate an operation mode that allows a frequency error within a second range greater than the first range of the high performance mode. In other words, the high performance mode may indicate an operation mode that requires high accuracy of the clock signal CLK. The low performance mode may indicate an operation mode that does not require high accuracy of the clock signal CLK or may indicate an operation mode in which comparatively low accuracy is allowed.

As described with reference to FIGS. 8 and 9, the switched capacitor 230 may perform a function similar to that of the external resistor R. The switched capacitor 230 may not include a specific resistance component due to a change of the clock signal CLK and a PVT variation of internal elements. Thus, reliability of the switched capacitor 230 may be degraded as compared with the external resistor R having a fixed resistance value.

In the case of using the switched capacitor 230, accuracy with respect to a distribution of the input voltage VIN may be reduced as compared with the case of using the external resistor R. This means that when using the switched capacitor 230, a frequency error (or frequency change) of the clock signal CLK becomes greater than when using the external resistor R.

Thus, in the case when the high performance mode is required (e.g., in the case where a more accurate clock signal CLK is required), the high performance mode of the temperature compensated crystal oscillator 200 may be embodied by deactivating the switched capacitor 230 and connecting the external resistor R to the second terminal T2.

On the other hand, in the case where the high performance mode is not required (e.g., in the case where the low performance mode is required or a frequency error of the clock signal CLK within a greater range is allowed), the low performance mode of the temperature compensated crystal oscillator 200 may be embodied by removing the external resistor R and activating the switched capacitor 230. As described above, in the case where the high performance mode is not needed, the cost incurred due to the external resistor R may be reduced by using switched capacitor 230 instead of the external resistor R. Thus, the cost incurred by the temperature compensated crystal oscillator 200 may be reduced by changing an operation mode according to an operation environment of an electronic circuit or an electronic device including the temperature compensated crystal oscillator 200.

Figure 11:
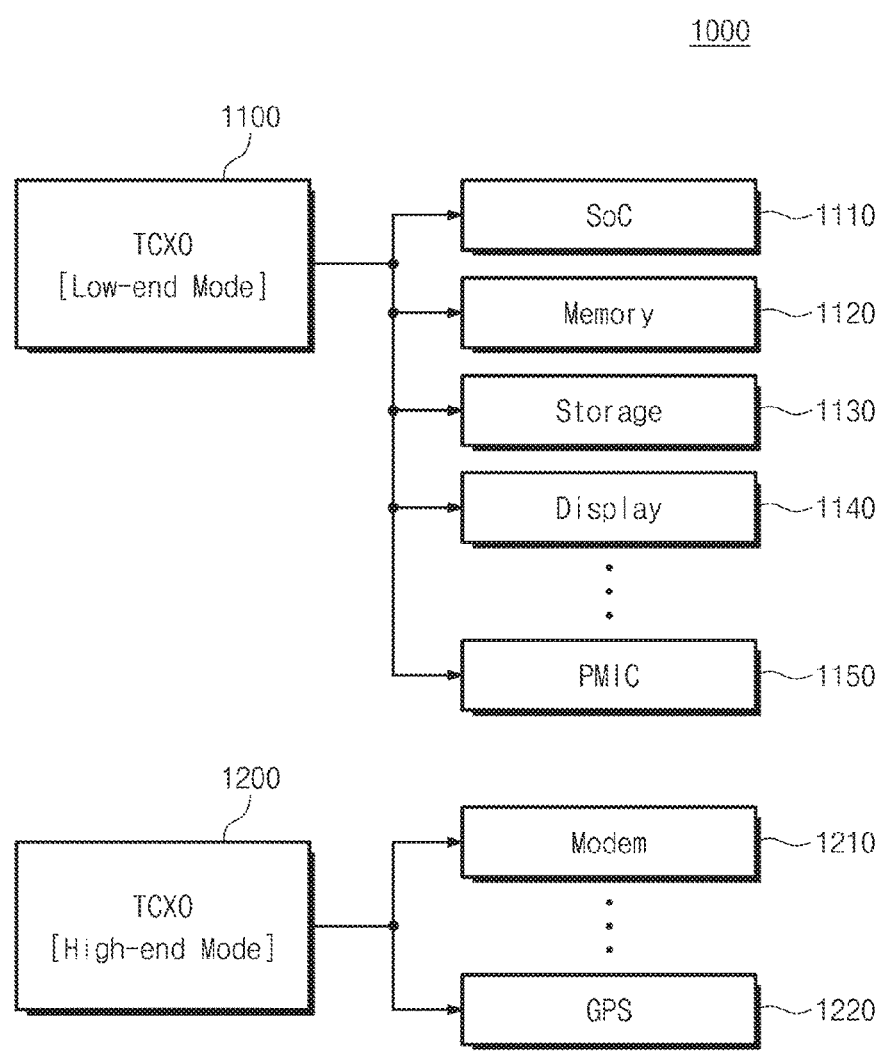
FIG. 11 is a view illustrating an application example of a temperature compensated crystal oscillator according to an exemplary embodiment of the inventive concept.

FIG. 11 is a view illustrating an application example of a temperature compensated crystal oscillator according to an exemplary embodiment of the inventive concept. Referring to FIG. 11, a user system 1000 may include first and second temperature compensated crystal oscillators (1100, 1200) and a plurality of configuration elements (1110 to 1150, 1210 to 1220). The first and second temperature compensated crystal oscillators (1100, 1200) may each be the temperature compensated crystal oscillator described with reference to FIGS. 1 through 10. The first temperature compensated crystal oscillator 1100 may be a temperature compensated crystal oscillator embodied in the low performance mode of FIG. 10. The second temperature compensated crystal oscillator 1200 may be a temperature compensated crystal oscillator embodied in the high performance mode of FIG. 10.

The plurality of configuration elements (1110 to 1150, 1210 to 1220) may include configuration elements such as a system-on-chip 1110, a memory module 1120, a storage module 1130, a display device 1140, a power management circuit 1150, a modem 1210, a global positioning system (GPS) 1220, etc. The configuration elements illustrated in FIG. 11 are only illustrative and the inventive concept is not limited thereto.

The first temperature compensated crystal oscillator 1100 may be configured to provide the clock signal CLK to some (e.g., the system-on-chip 1110, the memory module 1120, the storage module 1130, the display device 1140, the power management circuit 1150, etc.) of the configuration elements. These may be configuration elements that require relatively low reliability of the clock signal CLK.

The second temperature compensated crystal oscillator 1200 may be configured to provide the clock signal CLK to other (e.g., the modem 1210, the GPS 1220, etc.) configuration elements. These may be configuration elements that require relatively high reliability of the clock signal CLK.

The reliability with respect to the clock signal CLK may be predetermined by each of the configuration elements and thus each configuration element may receive the clock signal CLK from the first or second temperature compensated crystal oscillator 1100 or 1200.

The user system 1000 is merely an application example according to an exemplary embodiment of the inventive concept, and the inventive concept is not limited thereto. For example, the temperature compensated crystal oscillator may be included in each of the configuration elements or may be provided as a separate module. The user system 1000 may include only one of the first and second temperature compensated crystal oscillators (1100, 1200) depending on an operation environment of the user system 1000.

Figure 12:
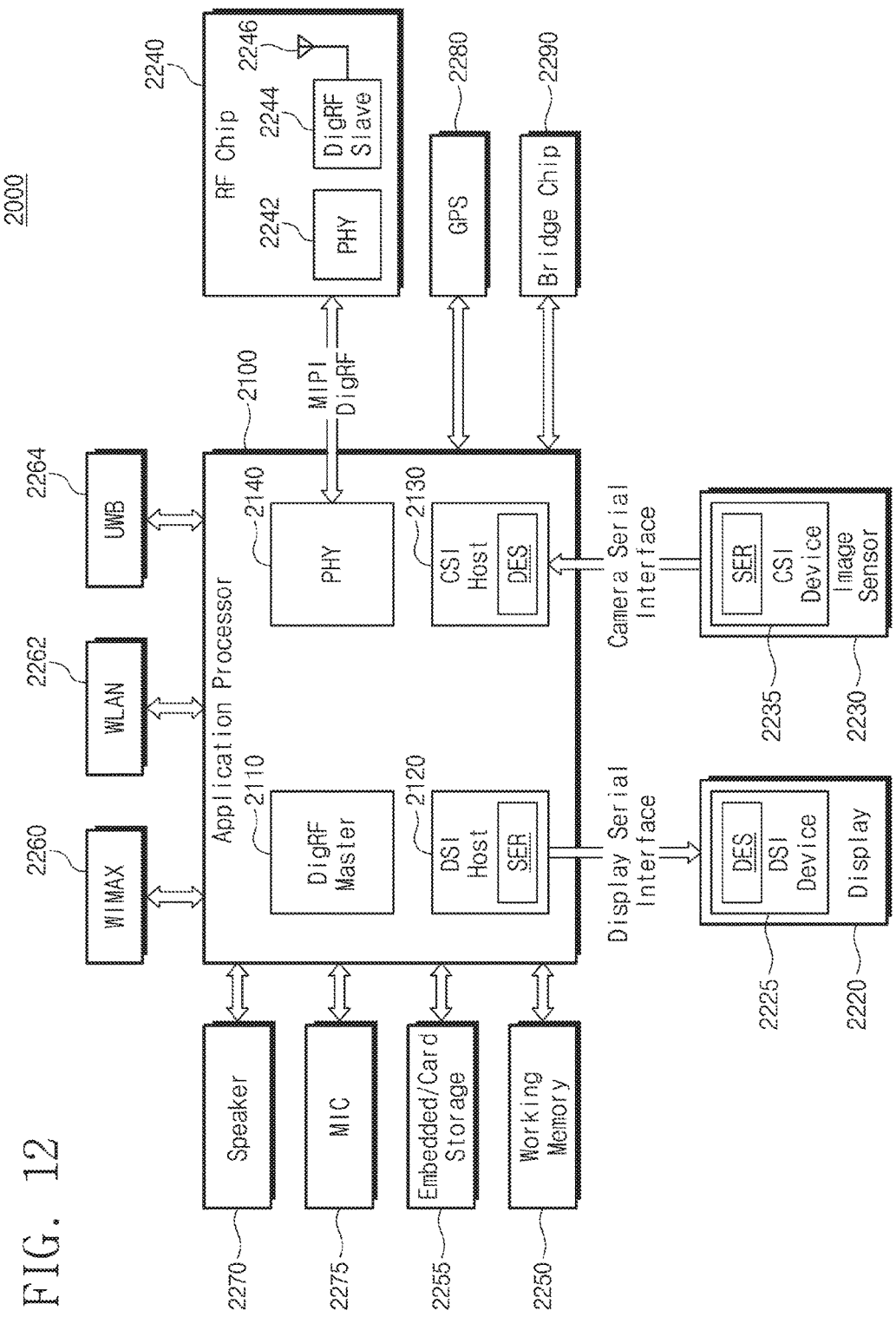
FIG. 12 is a block diagram illustrating an electronic system including a temperature compensated crystal oscillator according to an exemplary embodiment of the inventive concept.

FIG. 12 is a block diagram illustrating an electronic system including a temperature compensated crystal oscillator according to an exemplary embodiment of the inventive concept. Referring to FIG. 12, an electronic system 2000 may be embodied in the form of a portable communication terminal, a personal digital assistant (PDA), a portable media player (PMP), a smart phone, or a wearable device. Additionally, the electronic system 2000 may be embodied in the form of a personal computer, a server, a workstation, a notebook, etc.

The electronic system 2000 may include an application processor 2100 (or a central processing unit), a display 2220, and an image sensor 2230. The application processor 2100 may include a DigRF master 2110, a display serial interface (DSI) host 2120, a camera serial interface (CSI) host 2130, and a physical layer 2140.

The DSI host 2120 may communicate with a DSI device 2225 of the display 2220 through a DSI. An optical serializer SER may be embodied in the DSI host 2120. An optical deserializer DES may be embodied in the DSI device 2225.

The CSI host 2130 may communicate with the CSI device 2235 of the image sensor 2230. The optical deserializer DES may be embodied in the CSI host 2130. The optical serializer SER may be embodied in the CSI device 2235.

The electronic system 2000 may further include a radio frequency (RF) chip 2240 that communicates with the application processor 2100. The RF chip 2240 may include a physical layer 2242, a DigRF slave 2244, and an antenna 2246. The physical layer 2242 of the RF chip 2240 and the physical layer 2140 of the application processor 2100 may exchange data with each other by a MIPI DigRF interface.

The electronic system 2000 may further include a working memory 2250 and an embedded/card storage 2255. The working memory 2250 and the embedded/card storage 2255 may store data provided from the application processor 2100. The working memory 2250 and the embedded/card storage 2255 may provide the stored data to the application processor 2100.

The working memory 2250 may temporarily store data processed or to be processed by the application processor 2100. The working memory 2250 may include a volatile memory such as static random access memory (SRAM), dynamic RAM (DRAM), synchronous DRAM (SDRAM), etc. or a nonvolatile memory such as flash memory, phase-change RAM (PRAM), magnetic RAM (MRAM), resistive RAM (ReRAM), ferro-electric RAM (FRAM), etc.

The embedded/card storage 2255 may store data regardless of whether power is supplied or not.

The electronic system 2000 may communicate with an external system through world interoperability for microwave access (WiMAX) 2260, a wireless local area network (WLAN) 2262, ultra-wideband (UWB) 2264, etc.

The electronic system 2000 may further include a speaker 2270 and a microphone 2275 for processing voice information. The electronic system 2000 may further include a GPS device 2280 for processing location information. The electronic system 2000 may further include a bridge chip 2290 for managing a connection to peripheral devices.

Each of the configuration elements included in the electronic system 2000 may be configured to receive a reference clock from a crystal oscillator, included in the application processor 2100 or embodied by a separate functional block, and configured to operate based on the received reference clock. The crystal oscillator may be a temperature compensated crystal oscillator as described with reference to FIGS. 1 through 11.

As described above, the temperature compensated crystal oscillator may receive an input voltage from a thermistor and may detect a temperature of the temperature compensated crystal oscillator based on the received input voltage. The temperature compensated crystal oscillator may compensate a frequency change of a clock signal based on the detected temperature. Thus, since the temperature compensated crystal oscillator uses a relatively inexpensive thermistor as compared with a separate temperature sensor or diode, the cost for the temperature compensated crystal oscillator is reduced.

When detecting a temperature, the temperature compensated crystal oscillator performs a voltage controlled oscillator-based sensing operation. Accordingly, a temperature compensated crystal oscillator having a small area and reduced power consumption, as compared with a conventional ADC, is provided.

The temperature compensated crystal oscillator may include a switched capacitor. By using the switched capacitor according to an operation mode, the cost incurred by adding an external resistor may be reduced.

Thus, according to exemplary embodiments of the inventive concept, an oscillation controller having reduced cost and increased reliability and a temperature compensated crystal oscillator including the oscillation controller are provided.

While the inventive concept has been shown and described with reference to exemplary embodiments thereof, it will be apparent to those of ordinary skill in the art that various changes in form and details may be made thereto without departing from the spirit and scope of the inventive concept as set forth in the following claims.

What is claimed is:

1. A temperature compensated oscillation controller comprising:
 a temperature compensation circuit configured to provide a reference voltage through a first terminal and to receive an input voltage including temperature information through a second terminal; and
 an oscillation circuit configured to he connected to an external crystal resonator through third and fourth terminals and to output a clock signal in response to an oscillation signal from the external crystal resonator,
wherein the temperature compensation circuit is configured to perform a voltage controlled oscillator-based sensing operation to convert the input voltage into a temperature code and to adjust a frequency of the clock signal using the temperature code, and
wherein the temperature compensation circuit comprises:
a bandgap reference configured to generate the reference voltage;
a temperature sensing circuit configured to receive the input voltage and to generate the temperature code in response to the receives input voltage;
a control logic circuit configured to output a control signal using the temperature code; and
a capacitor bank configured to adjust a capacitance of each of the third and fourth terminals in response to the control signal.

2. The temperature compensated oscillation controller of claim 1, wherein the temperature sensing circuit comprises:
a first switch connected between the second terminal and a first node;
a voltage controlled oscillator configured to output an output signal in response to a voltage of the first node; and
a counter configured to output the temperature code by counting the output signal for a predetermined time.

3. The temperature compensated oscillation controller of claim 2, wherein the temperature sensing circuit further comprises:
a second switch connected between the first terminal and the first node; and
an automatic calibrator configured to receive the output signal and the clock signal and output a calibration signal by comparing the output signal with the clock signal,
wherein when the second switch is turned on, the first terminal is electrically connected to the first node, and
wherein the voltage controlled oscillator adjusts an internal parameter so that the output signal has a reference frequency corresponding to the clock signal in response to the calibration signal.

4. The temperature compensated oscillation controller of claim 1, wherein the control logic circuit includes a lookup table including information about a corresponding relation between the temperature code and the control signal and is configured to output the control signal corresponding to the temperature code using the lookup table.

5. The temperature compensated oscillation controller of claim 1, wherein the control logic circuit includes an estimator, and
wherein the estimator is configured to output the control signal by performing an arithmetic operation using a mathematical model of the external crystal resonator with respect to the temperature code.

6. The temperature compensated oscillation controller of claim 1, wherein the capacitor hank comprises:
at least one first capacitor connected to the third terminal; and
at least one second capacitor connected to the fourth terminal,
wherein the capacitor bank is configured to adjust a capacitance of the at least one first capacitor or the at least one second capacitor in response to the control signal.

7. The temperature compensated oscillation controller of claim 1, further comprising a switched capacitor that is connected to the second terminal and is configured to operate in response to the clock signal.

8. The temperature compensated oscillation controller of claim 7, wherein the switched capacitor comprises:
a non-overlapping clock generator configured to output a first switching signal and a second switching signal that does not overlap the first switching signal in response to the clock signal;
a capacitor;
a first switch connected between the second terminal and a first end of the capacitor and configured to operate in response to the first switching signal; and
a second switch connected between a ground and a second end of the capacitor and configured to operate in response to the second switching signal.

9. The temperature compensated oscillation controller of claim 7, wherein the switched capacitor is deactivated in a high performance mode and is activated in a low performance mode, and
wherein the high performance mode is an operation mode where a frequency change of the clock signal according to temperature is included in a first range and the low performance mode is an operation mode where the frequency change of the clock signal according to temperature is included in a second range that is wider than the first range.

10. A temperature compensated crystal oscillator comprising:
a temperature compensated oscillation controller including first through fourth terminals;
a thermistor connected to the first and second terminals; and
a crystal resonator connected to the third and fourth terminals,
wherein the temperature compensated oscillation controller comprises:
a temperature compensation circuit configured to provide a reference voltage through the first terminal and to receive an input voltage through the second terminal; and
an oscillation circuit connected to the third and fourth terminals and configured to output a clock signal in response to an oscillation signal of the crystal resonator,
wherein the temperature compensation circuit is configured to convert the input voltage into a temperature code by performing a voltage controlled oscillator-based sensing operation and to adjust a capacitance of the third and fourth terminals using the temperature code.

11. The temperature compensated crystal oscillator of claim 10, wherein the temperature compensated oscillation controller further comprises a switched capacitor that is connected to the second terminal and is configured to operate in response to the clock signal.

12. The temperature compensated crystal oscillator of claim 11, wherein the switched capacitor comprises:
a non-overlapping clock generator configured to output a first switching signal and a second switching signal that does not overlap the first switching signal in response to the clock signal;
a capacitor;
a first switch connected between the second terminal and a first end of the capacitor and configured to operate in response to the first switching signal; and a second switch connected between a ground and a second end of the capacitor and configured to operate in response to the second switching signal.

13. The temperature compensated crystal oscillator of claim 11, wherein in a high performance mode, the temperature compensated crystal oscillator further comprises an external resistor connected to the second terminal and the switched capacitor is deactivated.

14. The temperature compensated crystal oscillator of claim 10, wherein the temperature compensation circuit comprises:
a band gap reference configured to generate the reference voltage;
a temperature sensing circuit configured to receive the input voltage and to generate the temperature code in response to the received input voltage;
a control logic circuit configured to output a control signal using the temperature code; and
a capacitor bank configured to adjust a capacitance of the third and fourth terminals in response to the control signal.

15. A user system comprising:
a first plurality of configuration elements;
a second plurality of configuration elements;
a first temperature compensated crystal oscillator comprising a switched capacitor and configured to provide a clock signal to the first plurality of configuration elements; and
a second temperature compensated crystal oscillator comprising an external resistor and configured to provide the clock signal to the second plurality of configuration elements,
wherein each of the first and second temperature compensated crystal oscillators further comprises:
a temperature compensated oscillation controller including first through fourth terminals;
a thermistor connected to the first and second terminals; and
a crystal resonator connected to the third and fourth terminals,
wherein the temperature compensated oscillation controller comprises:
a temperature compensation circuit configured to provide a reference voltage through the first terminal and to receive an input voltage including temperature information through the second terminal; and
an oscillation circuit connected to the third and fourth terminals and configured to output the clock signal in response to an oscillation signal of the crystal resonator,
wherein the temperature compensation circuit is configured perform a voltage controlled oscillator-based sensing operation to convert the input voltage into a temperature code and to adjust a frequency of the clock signal using the temperature code.

16. The user system of claim 15, wherein the switched capacitor of the first temperature compensated crystal oscillator is connected to the second terminal of the first temperature compensated crystal oscillator, and
the external resistor of the second temperature compensated crystal oscillator is connected between the second terminal of the second temperature compensated crystal oscillator and a ground.

17. The user system of claim 16, wherein the switched capacitor comprises:
non-overlapping clock generator configured to output a first switching signal and a second switching signal that does not overlap the first switching signal in response to the clock signal;
a capacitor;
a first switch connected between the second terminal and a first end of the capacitor and configured to operate in response to the first switching signal; and
a second switch connected between the ground and a second end of the capacitor and configured to operate in response to the second switching signal.

18. The user system of claim 15, wherein the temperature compensating circuit comprises a temperature sensing circuit configured to receive the input voltage and to generate the temperature code in response to the received input voltage, and
wherein the temperature sensing circuit comprises:
a first switch connected between the first terminal and a first node;
a second switch connected between the second terminal and the first node;
a voltage controlled oscillator configured to output an output signal in response to a voltage of the first node;
a counter configured to output the temperature code by counting the output signal for a predetermined time;
an automatic calibrator configured to receive the output signal and the clock signal and output a calibration signal to the voltage controlled oscillator by comparing the output signal with the clock signal; and
a logic circuit configured to control the first and second switches.

19. The user system of claim 15, wherein the first plurality of configuration elements includes at least one of a system-on-chip, a memory module, a storage module, a display device, or a power management circuit, and
the second plurality of configuration elements includes at least one a modem or a global positioning system.

* * * * *